(12) United States Patent
Ranish

(10) Patent No.: US 10,672,641 B2
(45) Date of Patent: Jun. 2, 2020

(54) SOL GEL COATED SUPPORT RING

(71) Applicant: Applied Materials, Inc., Santa Clara, CA (US)

(72) Inventor: Joseph M. Ranish, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 187 days.

(21) Appl. No.: 15/935,469

(22) Filed: Mar. 26, 2018

(65) Prior Publication Data
US 2018/0211865 A1    Jul. 26, 2018

Related U.S. Application Data

(63) Continuation of application No. 14/521,545, filed on Oct. 23, 2014, now Pat. No. 9,929,037.

(60) Provisional application No. 61/900,835, filed on Nov. 6, 2013.

(51) Int. Cl.
  *H01L 21/687* (2006.01)
  *H01L 21/67* (2006.01)

(52) U.S. Cl.
  CPC .... *H01L 21/68757* (2013.01); *H01L 21/6719* (2013.01); *H01L 21/67109* (2013.01); *H01L 21/67115* (2013.01); *H01L 21/67248* (2013.01)

(58) Field of Classification Search
  None
  See application file for complete search history.

(56) References Cited

U.S. PATENT DOCUMENTS

| | | | |
|---|---|---|---|
| 5,639,517 A | 6/1997 | Floch et al. | |
| 5,848,889 A | 12/1998 | Tietz et al. | |
| 6,103,363 A | 8/2000 | Boire et al. | |
| 6,139,983 A | 10/2000 | Ohashi et al. | |
| 7,037,554 B2 | 5/2006 | Tao et al. | |
| 8,314,368 B2 | 11/2012 | Ranish et al. | |
| 2002/0088546 A1 | 7/2002 | Tanaka | |
| 2002/0152959 A1 | 10/2002 | Lee et al. | |
| 2004/0065259 A1* | 4/2004 | Inazumachi | H01J 37/32724 118/724 |
| 2005/0173803 A1 | 8/2005 | Lu et al. | |

(Continued)

FOREIGN PATENT DOCUMENTS

| | | |
|---|---|---|
| CN | 1815119 A | 8/2006 |
| CN | 101231941 A | 7/2008 |

(Continued)

OTHER PUBLICATIONS

International Search Report and Written Opinion for International Application No. PCT/US14/61720 dated Jan. 28, 2015.

(Continued)

*Primary Examiner* — Tyrone V Hall, Jr.
(74) *Attorney, Agent, or Firm* — Patterson + Sheridan, LLP

(57) ABSTRACT

A support member for a thermal processing chamber is described. The support member has a sol coating on at least one surface. The sol coating contains a material that blocks a desired wavelength or spectrum of radiation from being transmitted by the material of the support member. The sol coating may be a multi-layer structure that may include adhesion layers, transition layers, and cap layers, in addition to radiation-blocking layers.

15 Claims, 3 Drawing Sheets

(56) References Cited

U.S. PATENT DOCUMENTS

| | | | |
|---|---|---|---|
| 2006/0078839 A1* | 4/2006 | Adachi | H01L 21/6875 432/258 |
| 2008/0041798 A1 | 2/2008 | Gilmore et al. | |
| 2008/0169282 A1 | 7/2008 | Sorabji et al. | |
| 2010/0065216 A1 | 3/2010 | Tiller | |
| 2010/0148415 A1* | 6/2010 | Nakamura | H01L 21/67098 269/289 R |
| 2011/0024047 A1 | 2/2011 | Nguyen et al. | |
| 2012/0064733 A1 | 3/2012 | Sasajima et al. | |
| 2012/0151414 A1 | 6/2012 | Johnson et al. | |
| 2012/0235342 A1 | 9/2012 | Kurata | |
| 2013/0026693 A1 | 1/2013 | Ranish et al. | |
| 2014/0030533 A1 | 1/2014 | Sun et al. | |
| 2014/0113458 A1 | 4/2014 | Pan et al. | |
| 2014/0166840 A1 | 6/2014 | French et al. | |

FOREIGN PATENT DOCUMENTS

| | | |
|---|---|---|
| CN | 101714504 A | 5/2010 |
| CN | 101800176 | 8/2010 |
| JP | 10032237 A | 2/1998 |
| JP | 2005135946 A | 5/2005 |
| JP | 2012151414 A | 8/2012 |
| JP | 2003197722 A | 7/2013 |
| WO | 2013/019358 A1 | 2/2013 |

OTHER PUBLICATIONS

Office Action for U.S. Appl. No. 14/521,545 dated Apr. 8, 2016.
Office Action for U.S. Appl. No. 14/521,545 dated Sep. 23, 2016.
Final Office Action for U.S. Appl. No. 14/521,545 dated Apr. 20, 2017.
Office Action for U.S. Appl. No. 14/521,545 dated Sep. 22, 2017.
Office Action for Chinese Application No. 201480058904.8 dated Jul. 4, 2018.
Search Report for Chinese Application No. 201480058904.8 dated May 23, 2018.
Taiwan Office Action dated May 31, 2018 for Application No. 103137886.
Taiwan Search Report dated May 25, 2018 for Application No. 103137886.
Office Action from Chinese Patent Application No. 201480058904.8 dated Mar. 15, 2019.

* cited by examiner

SOL GEL COATED SUPPORT RING

CROSS-REFERENCE TO RELATED APPLICATIONS

This application claims benefit of U.S. patent application Ser. No. 14/521,545, filed Oct. 23, 2014, which claims benefit of U.S. Provisional Patent Application Ser. No. 61/900,835, filed Nov. 6, 2013, each of which is incorporated herein by reference.

BACKGROUND

Field

Embodiments of the present disclosure generally relate to a method and apparatus for processing semiconductor substrates. More specifically, to a method and apparatus for thermally treating semiconductor substrates.

Description of the Related Art

Thermal processing is common in the semiconductor industry. Thermal treatments are used to activate chemical and physical changes in semiconductor substrates to reorganize the atomic structure and composition of the substrate. In a commonly used approach known as Rapid Thermal Processing, the substrate is heated to a target temperature at a rate up to 400° C./sec, held at the target temperature for a short time such as 1 sec, and then rapidly cooled to a temperature below which no further changes occur.

To promote uniform processing of all areas of the substrate, temperature sensors are commonly deployed to monitor temperature at various locations of the substrate. Pyrometers are widely used to measure the temperature of the substrate. Control and measurement of substrate temperature, and therefore of local layer formation conditions, is complicated by thermal absorptions and light emissions by chamber components and exposure of sensors and chamber surfaces to processing conditions inside the processing chamber. There remains a need for a thermal processing chamber with improved temperature control, temperature measurement, and methods of operating such a chamber to improve uniformity and repeatability.

SUMMARY

Embodiments described herein relate to a support member for a thermal processing chamber that has a body comprising silicon oxide, the body having a radiation-facing side and a non-radiation-facing side, and a sol coating on at least the non-radiation-facing side. The sol coating may have a silica layer, a silicon layer, and a cap layer. The layer structure may have a graded composition, and may have one or more transition layers. A sol coating may also be applied to other surfaces of the support member.

BRIEF DESCRIPTION OF THE DRAWINGS

So that the manner in which the above recited features can be understood in detail, a more particular description may be had by reference to embodiments, some of which are illustrated in the appended drawings. It is to be noted, however, that the appended drawings illustrate only typical embodiments and are therefore not to be considered limiting of scope, for other embodiments may be equally effective.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
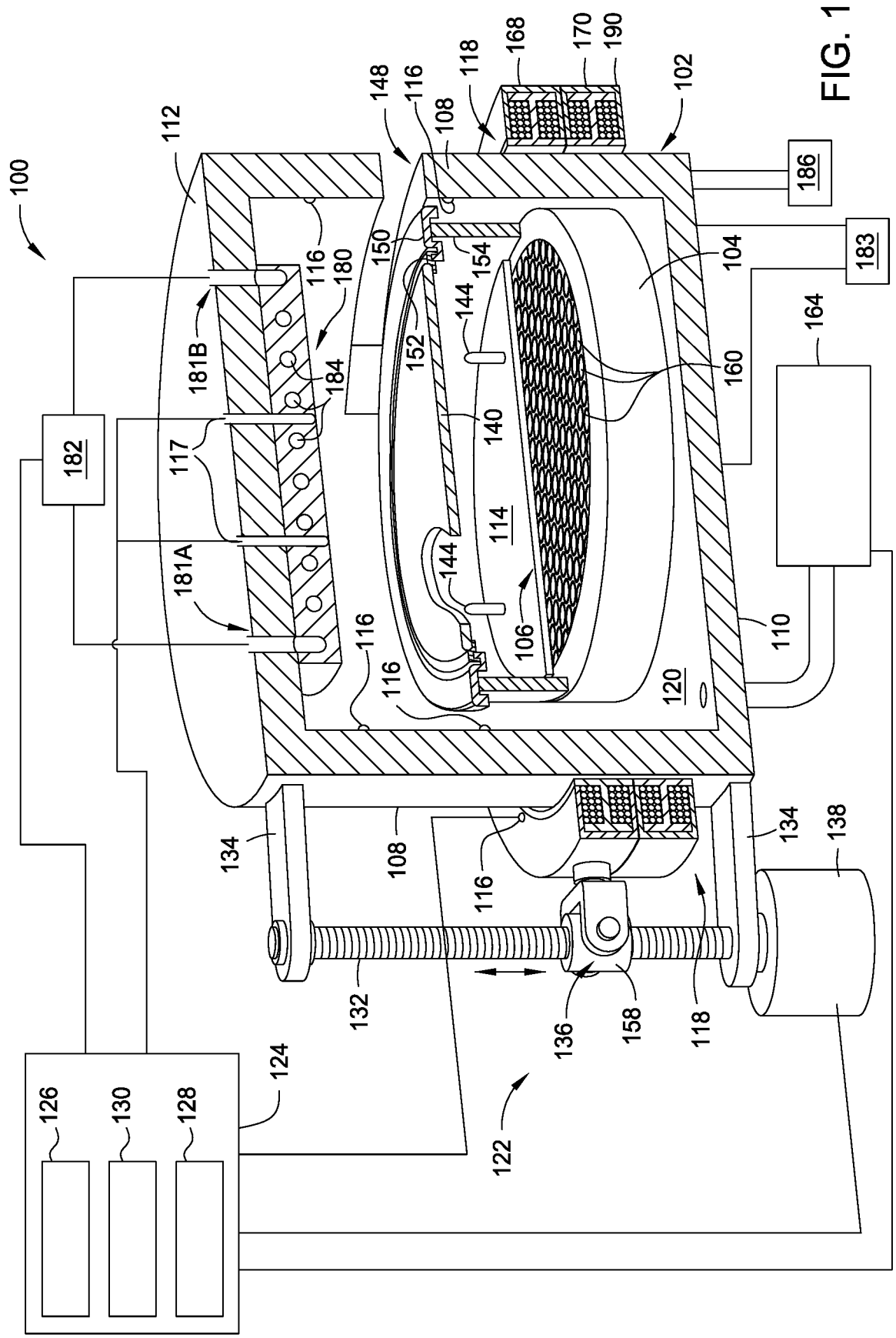
FIG. 1 is a simplified isometric view of one embodiment of a rapid thermal processing (RTP) chamber having a support ring according to one embodiment.

FIG. 1 is a simplified isometric view of one embodiment of a rapid thermal processing chamber 100. Examples of rapid thermal processing chambers that may be adapted to benefit from the invention are VULCAN™ and CENTURA® thermal processing systems, both available from Applied Materials, Inc., located in Santa Clara, Calif. Although the apparatus is described as utilized within a rapid thermal processing chamber, embodiments described herein may be utilized in other processing systems and devices where at least two temperature zones within one processing region is desired, such as substrate support platforms adapted for robot handoffs, orientation devices, deposition chambers, etch chambers, electrochemical processing apparatuses and chemical mechanical polishing devices, among others, particularly where the minimization of particulate generation is desired.

The processing chamber 100 includes a contactless or magnetically levitated substrate support 104, a chamber body 102, having walls 108, a bottom 110, and a top 112 defining an interior volume 120. The walls 108 typically include at least one substrate access port 148 to facilitate entry and egress of a substrate 140 (a portion of which is shown in FIG. 1). The access port may be coupled to a transfer chamber (not shown) or a load lock chamber (not shown) and may be selectively sealed with a valve, such as a slit valve (not shown). In one embodiment, the substrate support 104 is annular and the chamber 100 includes a radiant heat source 106 disposed in an inside diameter of the substrate support 104. Examples of an RTP chamber that may be modified and a substrate support that may be used is described in U.S. Pat. No. 6,800,833, filed Mar. 29, 2002 and issued on Oct. 5, 2004, U.S. patent application Ser. No. 10/788,979, filed Feb. 27, 2004 and published as United States Patent Publication No. 2005/0191044 on Sep. 1, 2005, both of which are incorporated by reference in their entireties.

The substrate support 104 is adapted to magnetically levitate and rotate within the interior volume 120. The substrate support 104 is capable of rotating while raising and lowering vertically during processing, and may also be raised or lowered without rotation before, during, or after processing. This magnetic levitation and/or magnetic rotation prevents or minimizes particle generation due to the absence or reduction of moving parts typically required to raise/lower and/or rotate the substrate support.

The substrate support 104 has a support cylinder 154, a support ring 150, and an edge ring 152. The support ring 150 rests on the support cylinder 154, and the edge ring 152 rests on, and is nested with, the support ring 150. The edge ring 152 has a substrate support surface for receiving a substrate for processing. The edge ring may be quartz, amorphous silica, or silicon carbide, and may be coated with silicon carbide. The support ring 150 may be quartz, bubble quartz, amorphous quartz, or amorphous silica. The support ring 150 has a sol coating that blocks transmission of light from the radiant heat source 106.

The chamber 100 also includes a window 114 made from a material transparent to heat and light of various wavelengths, which may include light in the infra-red (IR) spectrum, through which photons from the radiant heat source 106 may heat the substrate 140. In one embodiment, the window 114 is made of a quartz material, although other materials that are transparent to light may be used, such as sapphire. The window 114 may also include a plurality of lift pins 144 coupled to an upper surface of the window 114, which are adapted to selectively contact and support the substrate 140, to facilitate transfer of the substrate into and out of the chamber 100. Each of the plurality of lift pins 144 are configured to minimize absorption of energy from the radiant heat source 106 and may be made from the same material used for the window 114, such as a quartz material. The plurality of lift pins 144 may be positioned and radially spaced from each other to facilitate passage of an end effector coupled to a transfer robot (not shown). Alternatively, the end effector and/or robot may be capable of horizontal and vertical movement to facilitate transfer of the substrate 140.

In one embodiment, the radiant heat source 106 includes a lamp assembly formed from a housing which includes a plurality of honeycomb tubes 160 in a coolant assembly (not shown) coupled to a coolant source 183. The coolant source 183 may be one or a combination of water, ethylene glycol, nitrogen ($N_2$), and helium (He). The housing may be made of a copper material or other suitable material having suitable coolant channels formed therein for flow of the coolant from the coolant source 183. Each tube 160 may contain a reflector and a high-intensity lamp assembly or an IR emitter from which is formed a honeycomb-like pipe arrangement. This close-packed hexagonal arrangement of pipes provides radiant energy sources with high-power density and good spatial resolution. In one embodiment, the radiant heat source 106 provides sufficient radiant energy to thermally process the substrate, for example, annealing a silicon layer disposed on the substrate 140. The radiant heat source 106 may further comprise annular zones, wherein the voltage supplied to the plurality of tubes 160 by the controller 124 may varied to enhance the radial distribution of energy from the tubes 160. Dynamic control of the heating of the substrate 140 may be effected by the one or more temperature sensors 117 (described in more detail below) adapted to measure the temperature across the substrate 140.

A stator assembly 118 circumscribes the walls 108 of the chamber body 102 and is coupled to one or more actuator assemblies 122 that control the elevation of the stator assembly 118 along the exterior of the chamber body 102. In one embodiment (not shown), the chamber 100 includes three actuator assemblies 122 disposed radially about the chamber body, for example, at about 120° angles about the chamber body 102. The stator assembly 118 is magnetically coupled to the substrate support 104 disposed within the interior volume 120 of the chamber body 102. The substrate support 104 may comprise or include a magnetic portion to function as a rotor, thus creating a magnetic bearing assembly to lift and/or rotate the substrate support 104. In one embodiment, at least a portion of the substrate support 104 is partially surrounded by a trough (not shown) that is coupled to a fluid source 186, which may include water, ethylene glycol, nitrogen ($N_2$), helium (He), or combinations thereof, adapted as a heat exchange medium for the substrate support. The stator assembly 118 may also include a housing 190 to enclose various parts and components of the stator assembly 118. In one embodiment, the stator assembly 118 includes a drive coil assembly 168 stacked on a suspension coil assembly 170. The drive coil assembly 168 is adapted to rotate and/or raise/lower the substrate support 104 while the suspension coil assembly 170 may be adapted to passively center the substrate support 104 within the processing chamber 100. Alternatively, the rotational and centering functions may be performed by a stator having a single coil assembly.

An atmosphere control system 164 is also coupled to the interior volume 120 of the chamber body 102. The atmosphere control system 164 generally includes throttle valves and vacuum pumps for controlling chamber pressure. The atmosphere control system 164 may additionally include gas sources for providing process or other gases to the interior volume 120. The atmosphere control system 164 may also be adapted to deliver process gases for thermal deposition processes.

The chamber 100 also includes a controller 124, which generally includes a central processing unit (CPU) 130, support circuits 128 and memory 126. The CPU 130 may be one of any form of computer processor that can be used in an industrial setting for controlling various actions and sub-processors. The memory 126, or computer-readable medium, may be one or more of readily available memory such as random access memory (RAM), read only memory (ROM), floppy disk, hard disk, or any other form of digital storage, local or remote, and is typically coupled to the CPU 130. The support circuits 128 are coupled to the CPU 130 for supporting the controller 124 in a conventional manner. These circuits include cache, power supplies, clock circuits, input/output circuitry, subsystems, and the like.

In one embodiment, each of the actuator assemblies 122 generally comprise a precision lead screw 132 coupled between two flanges 134 extending from the walls 108 of the chamber body 102. The lead screw 132 has a nut 158 that axially travels along the lead screw 132 as the screw rotates. A coupling 136 is coupled between the stator 118 and nut 158 so that as the lead screw 132 is rotated, the coupling 136 is moved along the lead screw 132 to control the elevation of the stator 118 at the interface with the coupling 136. Thus, as the lead screw 132 of one of the actuators 122 is rotated to produce relative displacement between the nuts 158 of the other actuators 122, the horizontal plane of the stator 118 changes relative to a central axis of the chamber body 102.

In one embodiment, a motor 138, such as a stepper or servo motor, is coupled to the lead screw 132 to provide controllable rotation in response to a signal by the controller 124. Alternatively, other types of actuators 122 may be utilized to control the linear position of the stator 118, such as pneumatic cylinders, hydraulic cylinders, ball screws, solenoids, linear actuators and cam followers, among others.

The chamber 100 also includes one or more sensors 116, which are generally adapted to detect the elevation of the substrate support 104 (or substrate 140) within the interior volume 120 of the chamber body 102. The sensors 116 may be coupled to the chamber body 102 and/or other portions of the processing chamber 100 and are adapted to provide an output indicative of the distance between the substrate support 104 and the top 112 and/or bottom 110 of the chamber body 102, and may also detect misalignment of the substrate support 104 and/or substrate 140.

The one or more sensors 116 are coupled to the controller 124 that receives the output metric from the sensors 116 and provides a signal or signals to the one or more actuator assemblies 122 to raise or lower at least a portion of the substrate support 104. The controller 124 may utilize a positional metric obtained from the sensors 116 to adjust the elevation of the stator 118 at each actuator assembly 122 so that both the elevation and the planarity of the substrate support 104 and substrate 140 seated thereon may be adjusted relative to and a central axis of the RTP chamber 100 and/or the radiant heat source 106. For example, the controller 124 may provide signals to raise the substrate support by action of one actuator 122 to correct axial misalignment of the substrate support 104, or the controller may provide a signal to all actuators 122 to facilitate simultaneous vertical movement of the substrate support 104.

The one or more sensors 116 may be ultrasonic, laser, inductive, capacitive, or other type of sensor capable of detecting the proximity of the substrate support 104 within the chamber body 102. The sensors 116, may be coupled to the chamber body 102 proximate the top 112 or coupled to the walls 108, although other locations within and around the chamber body 102 may be suitable, such as coupled to the stator 118 outside of the chamber 100. In one embodiment, one or more sensors 116 may be coupled to the stator 118 and are adapted to sense the elevation and/or position of the substrate support 104 (or substrate 140) through the walls 108. In this embodiment, the walls 108 may include a thinner cross-section to facilitate positional sensing through the walls 108.

The chamber 100 also includes one or more temperature sensors 117, which may be adapted to sense temperature of the substrate 140 before, during, and after processing. In the embodiment depicted in FIG. 1, the temperature sensors 117 are disposed through the top 112, although other locations within and around the chamber body 102 may be used. The temperature sensors 117 may be optical pyrometers, as an example, pyrometers having fiber optic probes. The sensors 117 may be adapted to couple to the top 112 in a configuration to sense the entire diameter of the substrate, or a portion of the substrate. The sensors 117 may comprise a pattern defining a sensing area substantially equal to the diameter of the substrate, or a sensing area substantially equal to the radius of the substrate. For example, a plurality of sensors 117 may be coupled to the top 112 in a radial or linear configuration to enable a sensing area across the radius or diameter of the substrate. In one embodiment (not shown), a plurality of sensors 117 may be disposed in a line extending radially from about the center of the top 112 to a peripheral portion of the top 112. In this manner, the radius of the substrate may be monitored by the sensors 117, which will enable sensing of the diameter of the substrate during rotation.

The RTP chamber 100 also includes a cooling block 180 adjacent to, coupled to, or formed in the top 112. Generally, the cooling block 180 is spaced apart and opposing the radiant heat source 106. The cooling block 180 comprises one or more coolant channels 184 coupled to an inlet 181A and an outlet 181B. The cooling block 180 may be made of a process resistant material, such as stainless steel, aluminum, a polymer, or a ceramic material. The coolant channels 184 may comprise a spiral pattern, a rectangular pattern, a circular pattern, or combinations thereof and the channels 184 may be formed integrally within the cooling block 180, for example by casting the cooling block 180 and/or fabricating the cooling block 180 from two or more pieces and joining the pieces. Additionally or alternatively, the coolant channels 184 may be drilled into the cooling block 180.

As described herein, the chamber 100 is adapted to receive a substrate in a "face-up" orientation, wherein the deposit receiving side or face of the substrate is oriented toward the cooling block 180 and the "backside" of the substrate is facing the radiant heat source 106. The "face-up" orientation may allow the energy from the radiant heat source 106 to be absorbed more rapidly by the substrate 140 as the backside of the substrate is typically less reflective than the face of the substrate.

Although the cooling block 180 and radiant heat source 106 is described as being positioned in an upper and lower portion of the interior volume 120, respectively, the position of the cooling block 180 and the radiant heat source 106 may be reversed. For example, the cooling block 180 may be sized and configured to be positioned within the inside diameter of the substrate support 104, and the radiant heat source 106 may be coupled to the top 112. In this arrangement, the quartz window 114 may be disposed between the radiant heat source 106 and the substrate support 104, such as adjacent the radiant heat source 106 in the upper portion of the chamber 100. Although the substrate 140 may absorb heat more readily when the backside is facing the radiant heat source 106, the substrate 140 could be oriented in a face-up orientation or a face down orientation in either configuration.

The inlet 181A and outlet 181B may be coupled to a coolant source 182 by valves and suitable plumbing and the coolant source 182 is in communication with the controller 124 to facilitate control of pressure and/or flow of a fluid disposed therein. The fluid may be water, ethylene glycol, nitrogen ($N_2$), helium (He), or other fluid used as a heat exchange medium.

Figure 2:
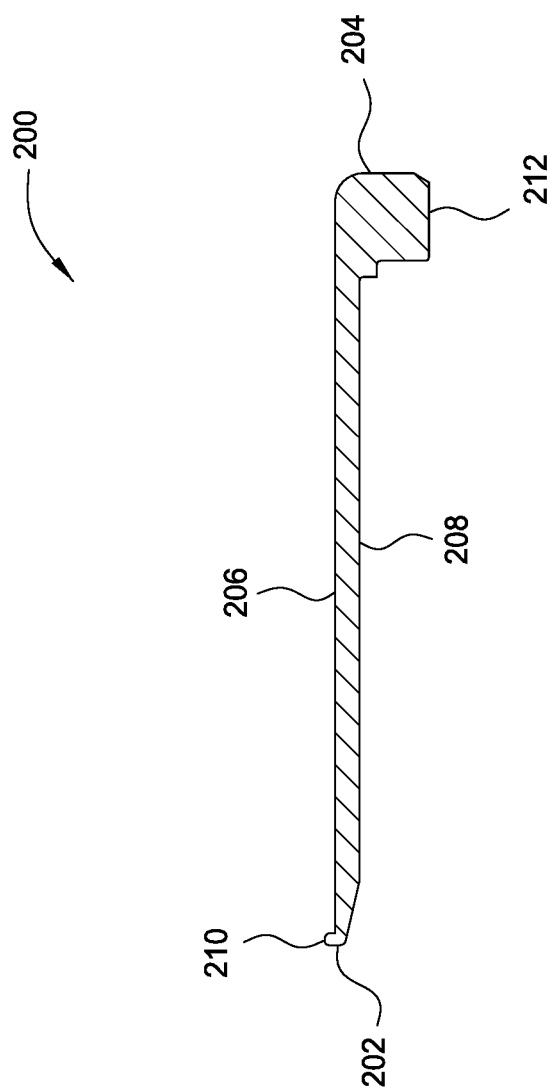
FIG. 2 is a cross-section of a support ring according to another embodiment.

FIG. 2 is a cross-section of a support member 200 according to one embodiment. The support member 200 may be used in the apparatus 100 as the support ring 150. The support member 200 may be an annular member with an inner radius 202 and an outer radius 204, and may have a first side 206 and a second side 208.

The inner radius 202 has a projection 210 that projects away from a plane substantially defined by the first side 206. The projection 210 can be used to engage with a complimentary projection on a second support member (not shown) such as the edge ring 152 of FIG. 1. Such engaged projections would be useful to securely position the second support member with respect to the support member 200.

The projection 210 may project from the first side 206 by a distance selected to maintain the second support member securely positioned. The length of the projection 210 is also governed by spacing constraints that may exist in a specific embodiment. Suitable values for the length of the projection 210 may be between about 0.01" and about 0.1", for example about 0.04".

The outer radius 204 may have a second projection 212 that projects from the second side 208. The projection 212 can be used to engage with a third support member (not shown) such as the support cylinder 154 of FIG. 1. The projection 212 securely positions the support member 200 with respect to the third support member. The two projections 210 and 212 thus provide secure positioning for the three support members, including the support member 200.

The second projection 212 of FIG. 2 may be located at a radius larger or smaller than the third support member. Thus, the second projection 212 may engage with the third support member by extending along an outer surface of the third support member, or by extending alone an inner surface of the third support member. The outer radius 204 typically extends beyond the radius of the third support member, so that the support member 200 rests on the third support member. If the second projection 212 is located at a radius smaller than that of the third support member, then the outer radius 204 will extend beyond the radius of the second projection 212. In the embodiment shown in FIG. 2, the radius of the second projection 212 is substantially the same as the outer radius 204.

The support member 200 may have a sol coating on at least one of the first side 206 and the second side 208 thereof. A sol coating is a coating formed from a sol. A sol is a material that has large molecules, for example molecules having nanometer dimensions, dispersed in a matrix such as a liquid carrier. The molecules may be macromolecules, polymers, or aggregates of smaller molecules. The matrix is typically a material that facilitates application of the sol to a surface, for example a liquid such as a lubricating material or a gel material. When dried, the sol can make a sol coating of varying porosity, depending on the degree of drying and heating.

Figure 3:
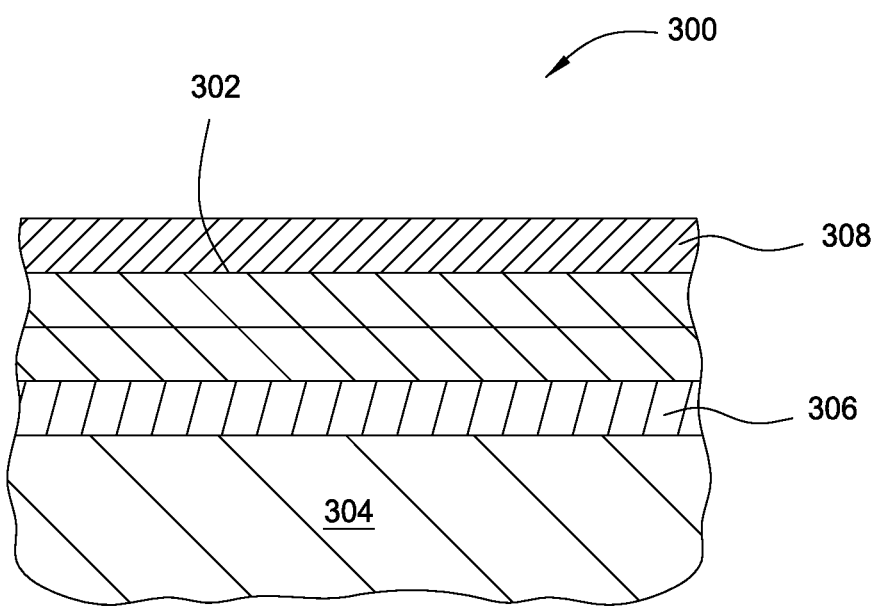
FIG. 3 is a cross-sectional view of a support member according to another embodiment.

FIG. 3 is a cross-sectional view of a support member 300 with a sol coating 302. The support member 300 may be the support member 200 with a sol coating applied thereto. The support member 300 may also be used as the support ring 150 of FIG. 1.

The sol coating 302 contains a material that prevents radiation detectable by the temperature sensors 117 of FIG. 1 from being transmitted and/or radiated by the support member 300. Such radiation reduces the ability of the temperature sensors 117 to detect radiation emitted by a substrate disposed in the thermal processing chamber. In low temperature thermal processes, radiation emitted by the substrate is reduced, so controlling sources of radiant noise improves temperature detection.

The support member 300 of FIG. 3 may have a silicon oxide body 304, which may be quartz, such as bubble quartz or amorphous quartz, or silica, such as amorphous silica. A silicon oxide body is typically transmissive of radiation detectable by the temperature sensors 117, so the sol coating 302 contains a material, such as silicon, that will block transmission of such radiation. The material may be silicon dioxide that has excess silicon, or the material may be silicon, which may be doped with oxygen. Typically, a material is chosen that transmits less than about 10 m % of incident radiation detectable by the temperature sensors 117. Such a material is generally said to be opaque to the incident radiation.

The sol coating 302 may be a layer structure, as shown in FIG. 3, or a single layer. The layer structure typically has more than one layer, which may be substantially the same composition or different compositions. Typically at least one of the layers will be substantially opaque to radiation, such as pyrometer radiation, that may be detected by the temperature sensors 117. One of the layers may be silicon. Another of the layers may be silica, an excess-silicon silica, a doped silicon, or another silicon containing material.

Adhesion of the sol coating 302 to the silicon oxide body 304 may be enhanced by use of a sol adhesion layer that may be a silica or an excess-silicon silica. The adhesion layer may be a sol layer. A silicon sol layer may be formed on the adhesion layer to improve adhesion of the silicon sol layer to the support member 300.

The layer structure of the sol coating 302 may feature a graded composition. A series of layers may be formed on the silicon dioxide body, each having different composition. For example, each layer of the sol coating 302 may have more silicon than the layer immediately subjacent. Any number of layers may be formed in this way to provide a progression in composition from a silica-like composition (i.e. near-stoichiometric silicon dioxide) to a substantially silicon layer, with only trace amounts of oxygen, if any at all. In this way, adhesion of the sol coating 302 may be improved.

The sol coating 302 may have a thickness between about 50 nm and about 50 µm, such as between about 100 nm and about 10 µm, for example about 1 µm. In a multi-layer sol coating, as shown in FIG. 3, each layer may have the same thickness, or the layers may have different thicknesses. For example, an adhesion layer of the layer structure may have a thickness greater than a radiation-blocking layer to maximize adhesion of the coating. For example, a single adhesion layer may have a thickness of about 0.5 µm, while a radiation-blocking layer has a thickness of only about 100 nm. In one embodiment of a multi-layer structure, the thickness of each layer is inversely proportional to its silicon content, such that the first sol layer having a composition similar to silica has a thickness greater than the second sol layer, which has more silicon than the first sol layer, and so on until the last layer of the multi-layer structure that has the least thickness, and is substantially composed of silicon.

The sol coating 302 may have a cap layer 308. The cap layer may be a durable material compatible with the rest of the sol coating 302, for example silica. The cap layer may be useful to prevent exposure of the silicon (or substantially silicon) radiation-blocking layer to silicon-reactive species such as oxygen or nitrogen. For relatively thick silicon layers, a surface exposure to oxygen during processing may produce a cap layer in-situ, with little deleterious effect. However, for thin silicon layers, a surface exposure to oxygen may degrade the radiation-blocking properties of the silicon layer, so a deposited cap layer may be useful in such embodiments.

Voids may be included in any of the sol layers or coatings. Because a sol typically includes solids dispersed in a liquid matrix, when the liquid is removed, voids may remain where the liquid formerly separated the solid particles. These voids impart a porosity to the resulting dried sol material. Heat treatment of the sol during and after the liquid removal process may eliminate some voids, reduce porosity, and/or densify the solid material remaining after removal of the liquid. The heat treatment may be performed at a temperature that is below a bubble point of the liquid, or the heat treatment may be performed at a temperature that is at or above the bubble point of the liquid. Use of a temperature that is at or above the bubble point of the liquid may promote formation of larger voids due to bubble formation in the sol. In a water system, where water is the liquid matrix, drying the mixture at or above 100° C. may promote formation of bubbles within the sol to produce larger voids and more porosity. In some embodiments, voids having a dimension between about 10 nm and about 60 µm, for example between about 100 nm and about 10 µm may be advantageous for reducing transmission of light through the coating. Porosity of a sol layer, after drying and heat treating, may be between about 35% and about 80%, for example between about 45% and about 60%.

In a layered sol process, where multiple sol layers are repeatedly deposited to build up a sol coating, porosity of each layer may be controlled to produce layers of different porosity. In some embodiments, porosity may also be graded through the coating. For example, the sol coating 302 of FIG. 3 may have a first porosity near the silicon oxide body 304 and a second porosity different from the first porosity near the surface of the sol coating 302. The second porosity may be less than the first porosity, or the second porosity may be greater than the first porosity.

Porosity may be adjusted through the sol coating by applying the sol coating in layers and heat treating and/or drying either periodically or after all layers are deposited. In one embodiment, every layer is individually dried after deposition. In another embodiment, every layer is dried and heat treated after deposition. Drying may be performed after deposition of a plurality of layers, so that the plurality of layers is dried at the same time. Drying and heat treating may be performed after deposition of a plurality of layers, so that the plurality of layers is dried and heat treated at the same time. The drying and heat treating applied to different layers may be different to achieve different levels of porosity in different layers. In this way, any desired porosity profile may be achieved using a layered sol coating. In addition, drying and/or heat treating of multiple layers at the same time may promote diffusion of composition and porosity among layers to reduce interfacial gradients between the layers. In one embodiment, a plurality of sol layers is deposited, the plurality of sol layers is dried and heat treated, and then a second plurality of sol layers is deposited, dried, and heat treated.

Carbon may be included with silicon and oxygen in the sol coatings described herein. Silicon carbide may be useful for blocking some frequencies of radiation that may be detected by the temperature sensors 117. A sol coating may contain a silicon sol layer and a silicon carbide sol layer, if desired, to broaden the spectrum blocked by the sol coating. The silicon carbide sol layer may be deposited adjacent to (above or below) a silicon sol layer, and the two layers may have a graded interface.

The sol coating is generally formed by a sol application process. One example is a sol gel process. A sol gel is applied to the silicon oxide body, and then a heat treatment sinters the sol into a coating. The sol coating formed in such a process is porous, and the porosity of the coating may be controlled by the severity of the heat treatment used to sinter the sol. Applying more heat will result in a denser coating, and vice versa. Porosity may be advantageous in some coatings to reduce transmission of radiation through the coating. A cap layer may be formed on the sol coating, according to another embodiment, by applying a high severity thermal treatment to the coating surface to densify the surface, leaving a porous layer under the cap layer. Such a high severity thermal treatment may be performed by a fire polishing process, a laser annealing process, or a plasma exposure process.

Silica may be made by a sol process using a composition comprising a silica precursor. Tetraethylorthosilicate (TEOS) is an example of a silica precursor that may be included in a sol with water to form silica by a sol process. The TEOS forms a silica gel polymer that can be dried into a silica matrix having porosity as described above. Other silicon alkoxides may also be used to form silica by a sol process. Silicon may be deposited by dispersing small silicon particles in a liquid such as an alcohol, applying the dispersion to the substrate, and drying the applied dispersion. The silicon particles act as a silicon precursor in the sol, and form a porous silicon layer when dried. Surfactants such as fatty acids (e.g. stearic acid, oleic acid) may be added to stabilize the silicon colloid. Mixtures of silicon particles in a silica precursor composition may be used to deposit sol materials having silicon and silica. Such mixtures may also be stabilized with fatty acids.

The layered structures having layers of different composition may be formed by sequential sol gel processes using sols of different composition. A first sol of a first composition is applied to the surface and dried to form a first sol layer. Then a second sol having a second composition different from the first composition may be applied to the surface and dried to form a second sol layer on the first sol layer. It should be noted that a graded interface, meaning an interface with a graded composition, which may be a transition layer, may be formed in a sol gel process by partially drying the first sol layer before applying the second sol layer. It is thought that, as the second sol layer is dried, the first sol layer also dries, and molecules at the interface between the two layers migrate across the interface to produce a graded composition at the interface.

Typically, the sol coating is formed on the non-radiation-facing side of the support member, but a sol coating may be formed on any desired surface of the support member to block transmission of radiation. Indeed, a sol coating may be applied to any desired surface of a radiant thermal processing chamber, such as the chamber of FIG. 1. In particular, a radiation-blocking sol coating may be applied to the support cylinder 154 and/or the edge ring 152, in addition to the support member 154. The sol coating, or each individual layer of the sol coating, may be formed by flow coating, spray coating, or spin coating a sol material onto a substrate. As noted above, each layer may be applied and dried/heat treated individually, or multiple layers may be applied between drying treatments or heat treatments. Heat treatments may be applied with the same frequency as drying treatments, or with different frequency. Viscosity of the sol material may be controlled by adjusting the liquid content and viscosity, or particle content and size of the sol material.

Sol coatings may be used with vapor-deposited coatings, if desired. A coating may be formed on the support member 200 by forming a vapor-deposited layer and a sol layer. For example, a silica or silicon-rich silica adhesion layer may be formed by vapor deposition, and then a silicon sol layer formed on the vapor deposited silica or silicon-rich silica adhesion layer. A plurality of vapor deposited layers may be formed over the silicon oxide body prior to forming the sol layer, if desired. The cap layer may also be vapor deposited if desired. A coating may be formed on a support member by applying a plurality of vapor deposited layers with one or more sol layers in some embodiments. The one or more sol layers provide a porosity typically not available in vapor deposited layers. The porosity enhances the radiation blocking properties of the coating.

While the foregoing is directed to embodiments of the present invention, other and further embodiments of the invention may be devised without departing from the basic scope thereof, and the scope thereof is determined by the claims that follow.

The invention claimed is:

1. A support member for a thermal processing chamber, comprising:
   a silicon oxide containing support ring;
   an edge ring configured to engage the silicon oxide containing support ring and configured to support a workpiece, the support ring having:
   a heterogeneous layer comprising silica formed on at least one side of the support ring.

2. The support member of claim 1, wherein the heterogeneous layer has a thickness from about 50 nm to about 50 µm.

3. The support member of claim 1, wherein the heterogeneous layer has a progression of composition from a silica-like composition to the silicon layer.

4. The support member of claim 1, wherein the heterogeneous layer has a porosity from about 35% to about 80%.

5. The support member of claim 1, wherein the heterogeneous layer comprises a first layer having a first porosity and a second layer having a second porosity different from the first porosity.

6. The support member of claim 5, wherein the porosity of the heterogeneous layer is graded.

7. The support member of claim 1, wherein the heterogeneous layer further comprises a radiation blocking layer and a cap layer.

8. A support member for a thermal processing chamber, comprising:
   a support cylinder; and
   a support ring configured to engage the support cylinder, the support ring comprising silicon oxide and having:
      a heterogeneous layer comprising silicon and silica on at least one side of the support ring.

9. The support member of claim 8, wherein the support ring comprises a projection configured to engage with the support cylinder.

10. The support member of claim 9, wherein the projection extends along an outer surface of the support cylinder.

11. The support member of claim 9, wherein the projection extends along an inner surface of the support cylinder.

12. The support member of claim 9, wherein the support ring has an outer radius configured to extend beyond an outer radius of the support cylinder.

13. The support member of claim 9, wherein the heterogeneous layer has a thickness from about 50 nm to about 50 µm.

14. The support member of claim 9, wherein the heterogeneous layer has a progression of composition from a silica-like composition to the silicon layer.

15. The support member of claim 9, wherein the heterogeneous layer comprises a first layer having a first porosity and a second layer having a second porosity different from the first porosity.

* * * * *